(12) United States Patent
Cho et al.

(10) Patent No.: US 9,978,327 B2
(45) Date of Patent: May 22, 2018

(54) GATE DRIVING CIRCUIT AND A DISPLAY DEVICE INCLUDING THE GATE DRIVING CIRCUIT

(71) Applicant: SAMSUNG DISPLAY CO., LTD., Yongin-si, Gyeonggi-Do (KR)

(72) Inventors: Duc-Han Cho, Seoul (KR); Beomjun Kim, Seoul (KR); Yoonho Kim, Asan-si (KR); Noboru Takeuchi, Asan-si (KR); Kangnam Kim, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 52 days.

(21) Appl. No.: 14/973,766

(22) Filed: Dec. 18, 2015

(65) Prior Publication Data
US 2016/0210928 A1 Jul. 21, 2016

(30) Foreign Application Priority Data
Jan. 21, 2015 (KR) ........................ 10-2015-0010221

(51) Int. Cl.
*G09G 3/36* (2006.01)
*G11C 19/18* (2006.01)
*G11C 19/28* (2006.01)

(52) U.S. Cl.
CPC ......... *G09G 3/3677* (2013.01); *G11C 19/184* (2013.01); *G11C 19/28* (2013.01); *G09G 3/3614* (2013.01)

(58) Field of Classification Search
USPC ........................................................ 345/100
See application file for complete search history.

(56) References Cited

U.S. PATENT DOCUMENTS

| 7,994,500 B2 | 8/2011 | Kim et al. |
| 8,148,779 B2 | 4/2012 | Jeong et al. |

(Continued)

FOREIGN PATENT DOCUMENTS

| JP | 2011-205624 | 10/2011 |
| KR | 1020100073294 | 7/2010 |

(Continued)

OTHER PUBLICATIONS

Kim, et al., "A Low-Power Oxide TFT Gate Driver for High-Resolution Display", IMID 2012 Digest, pp. 272-273.

*Primary Examiner* — Roy P Rabindranath
(74) *Attorney, Agent, or Firm* — F. Chau & Associates, LLC

(57) ABSTRACT

A gate driving circuit includes driving stages. Each of the driving stages applies each of gate signals to each of gate lines of a display panel. A k-th (k is a natural number equal to or greater than 2) driving stage includes a first output transistor, a capacitor, and first and second control transistor. The first output transistor includes a control electrode connected to a first node, an input electrode receiving a clock signal, and an output electrode outputting a k-th gate signal. The capacitor is connected between the output electrode of the first output transistor and the control electrode of the first output transistor. The first control transistor applies a first control signal to a second node to control a voltage of the first node before the k-th gate signal is output. The second control transistor is diode-connected between the second node and the first node.

14 Claims, 14 Drawing Sheets

(56) References Cited

U.S. PATENT DOCUMENTS

| | | | |
|---|---|---|---|
| 8,340,240 B2 | 12/2012 | Tsai et al. | |
| 8,541,258 B2 | 9/2013 | Kim et al. | |
| 8,587,347 B2* | 11/2013 | Yoon | G11C 19/184 |
| | | | 327/108 |
| 9,035,313 B2 | 5/2015 | Jeong et al. | |
| 2011/0316834 A1* | 12/2011 | Lee | G09G 3/3677 |
| | | | 345/211 |
| 2016/0203762 A1* | 7/2016 | Kim | G09G 3/3258 |
| | | | 345/76 |
| 2016/0203786 A1* | 7/2016 | Lim | G09G 3/20 |
| | | | 345/211 |

FOREIGN PATENT DOCUMENTS

| | | |
|---|---|---|
| KR | 1020140020391 | 2/2014 |
| KR | 1020140024994 | 3/2014 |
| KR | 1020140051136 | 4/2014 |

\* cited by examiner

US 9,978,327 B2

GATE DRIVING CIRCUIT AND A DISPLAY DEVICE INCLUDING THE GATE DRIVING CIRCUIT

CROSS-REFERENCE TO RELATED APPLICATION

This U.S. non-provisional patent application claims priority under 35 U.S.C. § 119 to Korean Patent Application No. 10-2015-0010221, filed on Jan. 21, 2015, in the Korean intellectual Property Office, the disclosure of which is incorporated by reference herein in its entirety.

TECHNICAL FIELD

The present inventive concept relates to a gate driving circuit, and more particularly to, a display device including the gate driving circuit.

DISCUSSION OF THE RELATED ART

A display device includes gate lines, data lines, and pixels. Each of the pixels is connected to a corresponding gate line of the gate lines and a corresponding data line of the data lines. The display device may include a gate driving circuit for applying gate signals to the gate lines, respectively and a data driving circuit for applying data signals to data lines, respectively. The gate driving circuit includes a plurality of driving stage circuits, e.g., shift registers, for providing the gate signals. When a high voltage is applied to a transistor of each driving stage, performance of the transistor may deteriorate, and thus, a corresponding gate signal may be delayed.

SUMMARY

According to an exemplary embodiment of the present inventive concept, a gate driving circuit is provided. The gate driving circuit includes a plurality of driving stages. Each of the driving stages applies a corresponding one of gate signals to a corresponding one of gate lines of a display panel. A k-th (k is a natural number equal to or greater than 2) driving stage among the driving stages includes a first output transistor, a capacitor, a first control transistor, and a second control transistor. The first output transistor includes a control electrode connected to a first node, an input electrode receiving a clock signal, and an output electrode outputting a k-th gate signal generated on the basis of the clock signal. The capacitor is connected between the output electrode of the first output transistor and the control electrode of the first output transistor. The first control transistor applies a first control signal to a second node to control a voltage of the first node before the k-th gate signal is output. The second control transistor includes input and control electrodes commonly connected to the second node, and an output electrode connected to the first node such that a current path is formed between the second node and the first node. A second control signal synchronized with the k-th gate signal is applied to the second node after the first control signal is applied to the second node.

In an exemplary embodiment of the present inventive concept, the first control transistor may include control and input electrodes commonly receiving a signal output from a (k−1)-th driving stage, and an output electrode outputting the first control signal.

In an exemplary embodiment of the present inventive concept, the signal output from the (k−1)-th driving stage may correspond to a (k−1)-th carry signal output from the (k−1)-th driving stage.

In an exemplary embodiment of the present inventive concept, the first control transistor may include a control electrode receiving the signal output from the (k−1)-th driving stage, an input electrode receiving a bias voltage, and an output electrode outputting the first control signal.

In an exemplary embodiment of the present inventive concept, the signal output from the (k−1)-th driving stage may correspond to a (k−1)-th carry signal output from the (k−1)-th driving stage, and the bias voltage may be substantially the same as a high level of the (k−1)-th carry signal.

In an exemplary embodiment of the present inventive concept, the gate driving circuit may further include a second output transistor. The second output transistor may include a control electrode connected to the first node, an input electrode receiving the clock signal, and an output electrode outputting a k-th carry signal generated on the basis of the clock signal.

In an exemplary embodiment of the present inventive concept, the second control signal may correspond to the k-th carry signal output from the k-th driving stage.

In an exemplary embodiment of the present inventive concept, the gate driving circuit may further include a third control transistor. The third control transistor may include control and input electrodes commonly receiving the k-th carry signal, and an output electrode outputting the second control signal.

In an exemplary embodiment of the present inventive concept, the gate driving circuit may further include a fourth control transistor. The fourth control transistor may apply a first discharge voltage to the first node such that the first output transistor is turned off after the k-th gate signal is output.

In an exemplary embodiment of the present inventive concept, the gate driving circuit may further include a fifth control transistor. The fifth control transistor may apply a second discharge voltage to the second node after the k-th gate signal is output.

In an exemplary embodiment of the present inventive concept, the fifth control transistor may include a control electrode receiving a switching signal, an input electrode receiving the second discharge voltage, and an output electrode connected to the second node. The switching signal may correspond to a (k+1)-th carry signal output from a (k+1)-th driving stage of the driving stages.

According to an exemplary embodiment of the present inventive concept, a gate driving circuit is provided. The gate driving circuit includes a plurality of driving stages. Each of the plurality of driving stages applies a corresponding one of gate signals to a corresponding one of gate lines of a display panel. A k-th (k is a natural number equal to or greater than 2) driving stage among the driving stages includes an output part, a control part, an inverter part, and a pull-down part. The output part outputs a k-th gate signal through a k-th output node and a k-th carry signal through a k-th carry node in response to a voltage of a first node. The k-th gate signal and the k-th carry signal are generated on the basis of a clock signal. The control part controls the voltage of the first node. The inverter part outputs a switching signal generated on the basis of the clock signal. The pull-down part pulls down voltages of the k-th output node and the k-th carry node. The control part includes a first control transistor, a second control transistor, and a third control transistor. The first control transistor applies a first control signal to a second node to control a voltage of the first node before the k-th gate signal is output. The second control transistor includes control and input electrodes commonly connected to the second node, and an output electrode connected to the first node. The third control transistor includes control and input electrodes commonly receiving the k-th carry signal, and an output electrode connected to the second node.

In an exemplary embodiment of the present inventive concept, the first control transistor may include control and input electrodes commonly receiving a (k−1)-th carry signal output from a (k−1)-th driving stage, and an output electrode outputting the first control signal.

In an exemplary embodiment of the present inventive concept, the first control transistor may include a control electrode receiving a (k−1)-th carry signal output from a (k−1)-th driving stage, an input electrode receiving a bias voltage having a same level as a high level of the (k−1)-th carry signal, and an output electrode outputting the first control signal.

In an exemplary embodiment of the present inventive concept, the control part may further include a capacitor, a fourth control transistor, and a fifth control transistor. The capacitor may increase the voltage of the first node in response to the k-th gate signal. The fourth control transistor may apply a first discharge voltage to the first node in response to a (k+1)-th carry signal output from a (k+1)-th driving stage after the k-th gate signal is output. The fifth control transistor may apply a second discharge voltage to the first node in response to the switching signal after the first discharge voltage is applied to the first node through the fourth control transistor.

In an exemplary embodiment of the present inventive concept, the control part may further include a sixth control transistor applying a third discharge voltage to the second node in response to the (k+1)-th carry signal output from the (k+1)-th driving stage after the k-th gate signal is output.

In an exemplary embodiment of the present inventive concept, the output part may include first and second output transistors. The first output transistor may output the k-th gate signal. The second output transistor may output the k-th carry signal.

In an exemplary embodiment of the present inventive concept, the pull-down part may include first and second pull-down parts. The first pull-down part may pull down a voltage of an output electrode of the first output transistor upon the arrival of the (k+1)-th carry signal. The second pull-down part may pull down a voltage of an output electrode of the second output transistor upon the arrival of the (k+1)-th carry signal.

In an exemplary embodiment of the present inventive concept, the first pull-down part may include first and second pull-down transistors. The first pull-down transistor may apply a first discharge voltage to the output electrode of the first output transistor in response to the (k+1)-th carry signal. The second pull-down transistor may apply the first discharge voltage to the output electrode of the first output transistor in response to the switching signal after the first discharge voltage is applied to the output electrode of the first output transistor through the first pull-down transistor.

In an exemplary embodiment of the present inventive concept, the second pull-down part may include third and fourth pull-down transistors. The third pull-down transistor may apply a second discharge voltage to the output electrode of the second output transistor in response to the (k+1)-th carry signal. The fourth pull-down transistor may apply the second discharge voltage to the output electrode of the second output transistor in response to the switching signal after the second discharge voltage is applied to the output electrode of the second output transistor through the third pull-down transistor.

In an exemplary embodiment of the present inventive concept, the pull-down part may pull down the voltages of the k-th output node and the k-th carry node upon arrival of a (k+1)-th carry signal output from a (k+1)-th driving stage.

According to an exemplary embodiment of the present inventive concept, a gate driving circuit is provided. The gate driving circuit includes first through third driving stages. The first driving stage outputs a first gate signal and a first carry signal to a first gate line and an input terminal of a second driving stage, respectively, during a first period. The second driving stage outputs a second gate signal and a second carry signal to a second gate line and an input terminal of a third driving stage, respectively, during a second period subsequent to the first period. The third driving stage outputs a third gate signal and a third carry signal to a third gate line and an input terminal of a fourth driving stage, respectively, during a third period subsequent to the second period. The second driving stage includes first and second control devices. The first control device receives the first carry signal and applies a first control signal to a first node during the first period based on the first carry signal. The second control device applies a second control signal to the first node during the second period. The second control signal corresponds to the second carry signal or the second gate signal.

The gate driving circuit may further include a first output transistor. The first output transistor may include an output electrode outputting the second gate signal, a control electrode connected to the second node, and an input electrode receiving a clock signal.

The first control device may be a first transistor. The first transistor may include control and input electrodes commonly receiving the first carry signal, and an output electrode outputting the first control signal.

The first control device may be a second transistor. The second transistor may include a control electrode receiving the first carry signal, an input electrode receiving a bias voltage, and an output electrode outputting the first control signal. The bias voltage may be substantially the same as a high level of the first carry signal.

The first control device may be a first diode including an anode receiving the first carry signal, and a cathode outputting the first control signal.

The second control device may be a third transistor. The third transistor may include input and control electrodes commonly connected to a carry terminal outputting the second carry signal, and an output electrode connected to the first node.

The second control device may be a fourth transistor. The fourth transistor may include an input electrode connected to a carry terminal outputting the second carry signal, a control electrode connected to an output node outputting the second gate signal, and an output electrode connected to the first node.

The second control device may be a second diode including an anode connected to a carry terminal outputting the second carry signal, and a cathode connected to the first node.

The gate driving circuit may further include a fifth control transistor connected between the first node and a second node connected to an output node through a capacitor. The output node may output the second gate signal. The fifth control transistor may include control and input electrodes commonly connected to the first node, and an output electrode connected to the second node.

The gate driving circuit may further include a third diode connected between the first node and a second node connected to an output node through a capacitor. The output node may output the second gate signal. The third diode may include an anode connected to the first node and a cathode connected to the second node.

BRIEF DESCRIPTION OF THE DRAWINGS

The above and other features of the present inventive concept will become more apparent with reference to the following figures, in which.

DETAILED DESCRIPTION OF THE EMBODIMENTS

Like numbers may refer to like elements throughout the written description and drawings. As used herein, the term "and/or" includes any and all combinations of one or more of the associated listed items. As used herein, the singular forms, "a", "an" and "the" are intended to include the plural forms as well, unless the context clearly indicates otherwise.

Hereinafter, exemplary embodiments of the present inventive concept will be described in detail with reference to the accompanying drawings.

Figure 1:
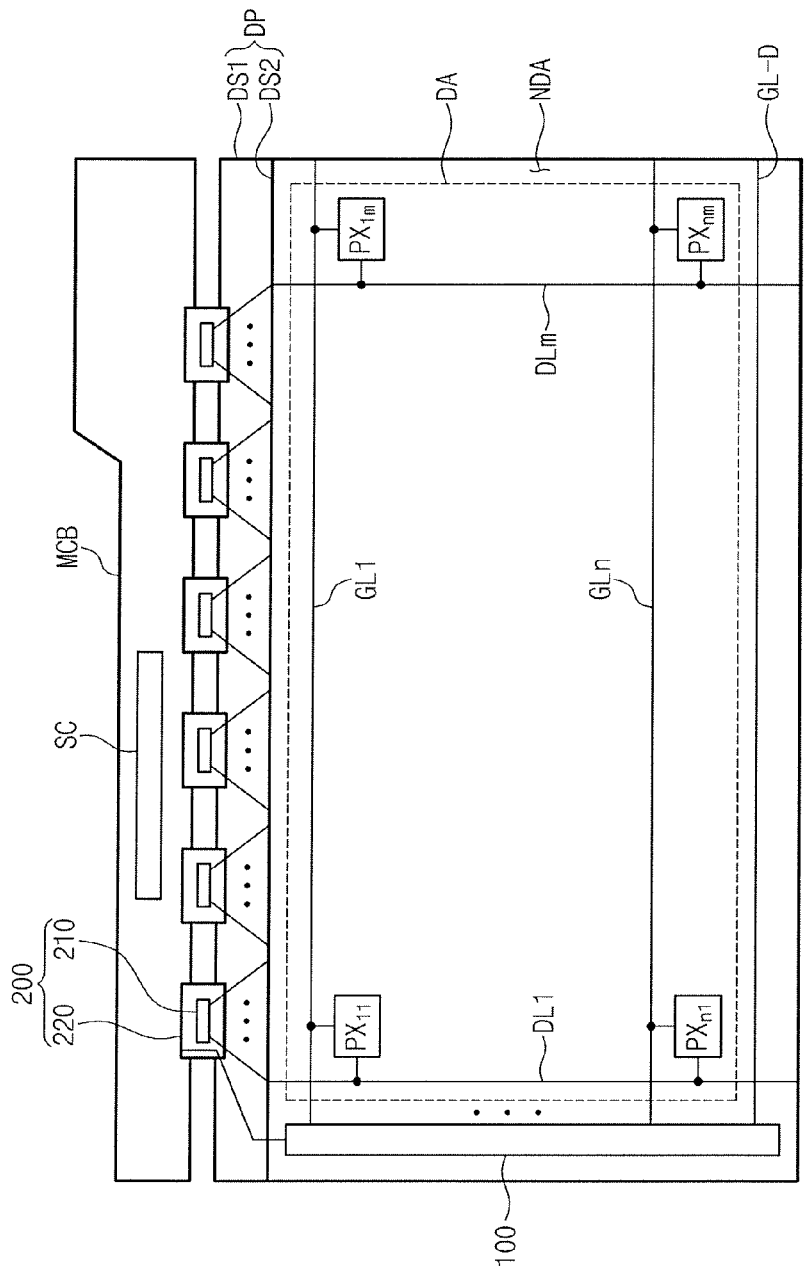
FIG. 1 is a plan view showing a display device according to an exemplary embodiment of the present inventive concept.
Figure 2:
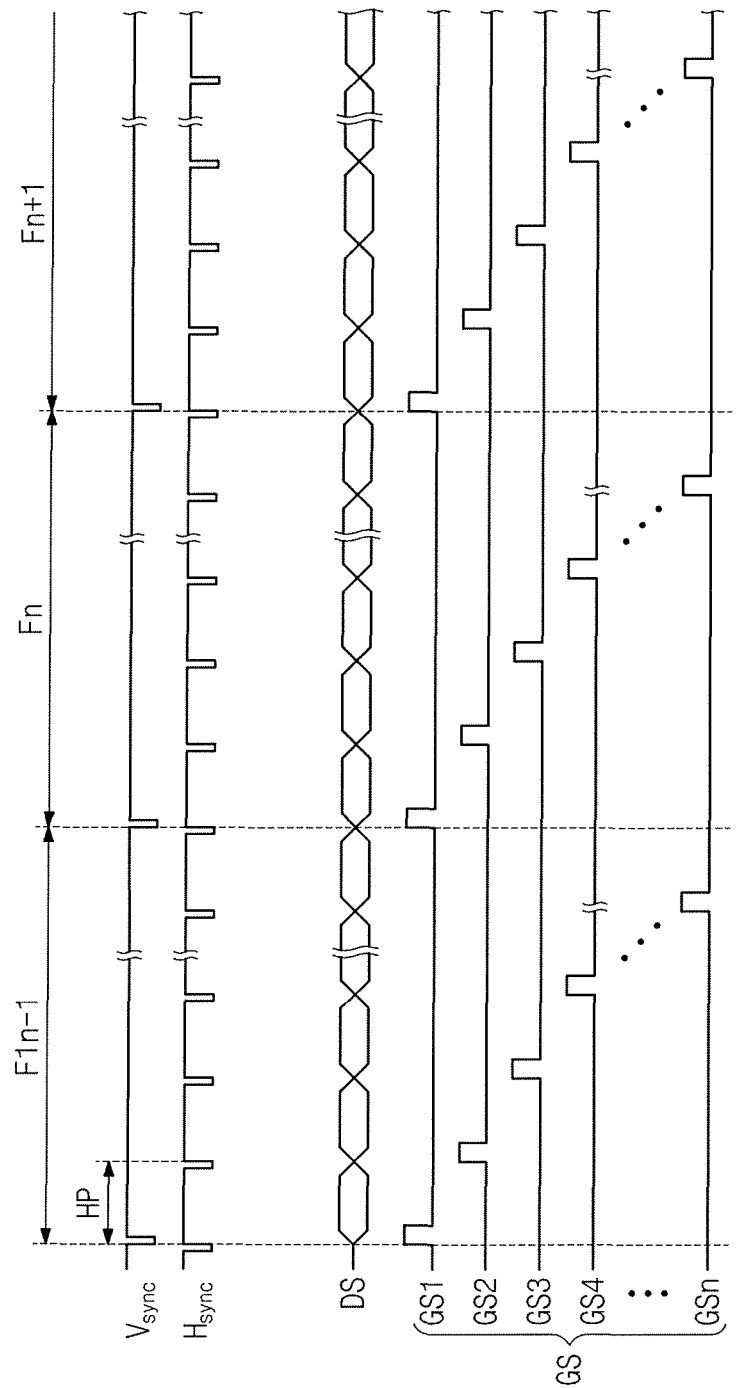
FIG. 2 is a timing diagram showing signals of a display device according to an exemplary embodiment of the present inventive concept.

FIG. 1 is a plan view showing a display device according to an exemplary embodiment of the present inventive concept, and FIG. 2 is a timing diagram showing signals of a display device according to an exemplary embodiment of the present inventive concept.

Referring to FIGS. 1 and 2, the display device includes a display panel DP, a gate driving circuit 100, and a data driving circuit 200.

The display panel DP may be various display panels, such as a liquid crystal display panel, an organic light emitting display panel, an electrophoretic display panel, an electrowetting display panel, etc. In an exemplary embodiment, the liquid crystal display panel will be described as the display panel DP. In addition, a liquid crystal display device including the liquid crystal display panel may further include a polarizer and a backlight unit. The display panel DP includes a first substrate DS1, a second substrate DS2 spaced apart from the first substrate DS1, and a liquid crystal layer disposed between the first and second substrates DS1 and DS2. The display panel DP includes a display area DA in which a plurality of pixels $PX_{11}$ to $PX_{nm}$ is disposed and a non-display area NDA surrounding the display area DA when viewed in a plan view. Here, n and m are positive integers.

The display panel DP includes a plurality of gate lines GL1 to GLn disposed on the first substrate DS1 and a plurality of data lines DL1 to DLm crossing the gate lines GL1 on the first substrate DS1. The gate lines GL1 to GLn are connected to the gate driving circuit 100. The data lines DL1 to DLm are connected to the data driving circuit 200. FIG. 1 shows a portion of the gate lines GL1 to GLn and a portion of the data lines DL1 to DLm. The display panel DP may further include a dummy gate line GL-D disposed in the non-display area NDA of the first substrate DS1.

FIG. 1 shows a portion of the pixels $PX_{11}$ to $PX_{nm}$. Each of the pixels $PX_{11}$ to $PX_{nm}$ is connected to a corresponding gate line of the gate lines GL1 to GLn and a corresponding data line of the data lines DL1 to DLm. The dummy gate line GL-D might not be connected to the pixels $PX_{11}$ to $PX_{nm}$.

The pixels $PX_{11}$ to are grouped into a plurality of groups according to colors to be displayed by the pixels $PX_{11}$ to $PX_{nm}$. Each of the pixels $PX_{11}$ to $PX_{nm}$ displays one of primary colors. The primary colors may include, but not limited to, a red color, a green color, a blue color, and a white color. The primary colors may further include various colors, e.g., yellow, cyan, magenta, etc.

The gate driving circuit 100 and the data driving circuit 200 receive control signals from a signal controller SC, e.g., a timing controller. The signal controller SC is mounted on a main circuit board MCB. The signal controller SC receives image data and control signals from an external graphic controller. The control signals include clock signals, a vertical synchronization signal Vsync serving as a signal to distinguish among frame periods Fn−1, Fn, and Fn+1, a horizontal synchronization signal Hsync serving as a row distinction signal to distinguish among horizontal periods HP, and a data enable signal maintained at a high level during a period, in which data are output, to indicate a data input period.

The gate driving circuit 100 generates gate signals GS1 to GSn in response to the control signal (hereinafter, referred to as a gate control signal) provided from the signal controller SC during the frame periods Fn−1, Fn, and Fn+1 and applies the gate signals GS1 to GSn to the gate lines GL1 to GLn, respectively. The gate signals GS1 to GSn are sequentially output to correspond to the horizontal periods HP. The gate driving circuit 100 may be substantially simultaneously formed together with the pixels $PX_{11}$ to $PX_{nm}$ through a thin film process. For example, the gate driving circuit 100 may be mounted on the non-display area NDA in an amorphous silicon TFT gate driver circuit (ASG) form or an oxide semiconductor TFT gate driver circuit (OSG) form.

FIG. 1 shows a single gate driving circuit 100 connected to first ends of the gate lines GL1 to GLn as an example. However, in an exemplary embodiment, the display device may include two gate driving circuits. In this case, one gate driving circuit of the two gate driving circuits is connected to the first ends of the gate lines GL1 to GLn and the other gate driving circuit of the two gate driving circuits is connected to second ends of the gate lines GL1 to GLn. In addition, one gate driving circuit of the two gate driving circuits is connected to odd-numbered gate lines of the gate lines GL1 to GLn, and the other gate driving circuit of the two gate driving circuits is connected to even-numbered gate lines of the gate lines GL1 to GLn.

The data driving circuit 200 generates grayscale voltages corresponding to the image data provided from the signal controller SC in response to the control signal (hereinafter, referred to as a data signal) provided from the signal controller SC. The data driving circuit 200 applies the grayscale voltages to the data lines DL1 to DLm, respectively, as data voltages DS.

The data voltages DS include positive (+) data voltages having a positive polarity with respect to a common voltage and/or negative (−) data voltages having a negative polarity with respect to the common voltage. For example, a portion of the data voltages DS applied to the data lines DL1 to DLm during each horizontal period HP has the positive polarity, and the other portion of the data voltages DS applied to the data lines DL1 to DLm during each horizontal period HP has the negative polarity. The polarity of the data voltages DS is inverted according to the frame periods Fn−1, Fn, and Fn+1 to prevent liquid crystals from burning and deteriorating. For example, the data driving circuit 200 generates the data voltages DS inverted by a unit of frame period in response to an inversion signal.

The data driving circuit 200 includes a driving chip 210 and a flexible circuit board 220 on which the driving chip 210 is mounted. For example, more than one driving chip 210 may be provided, and more than one flexible circuit board 220 may be provided. The flexible circuit board 220 electrically connects the main circuit board MCB and the first substrate DS1. Each of the driving chips 210 applies a corresponding data voltage of the data voltages DS to a corresponding data line of the data lines DL1 to DLm.

In FIG. 1, the data driving circuit 200 is provided in a tape carrier package (TCP) form, but the present inventive concept is not limited thereto. For example, the data driving circuit 200 may be mounted on the first substrate DS1 in a chip-on-glass (COG) form to correspond to the non-display area NDA.

Figure 3:
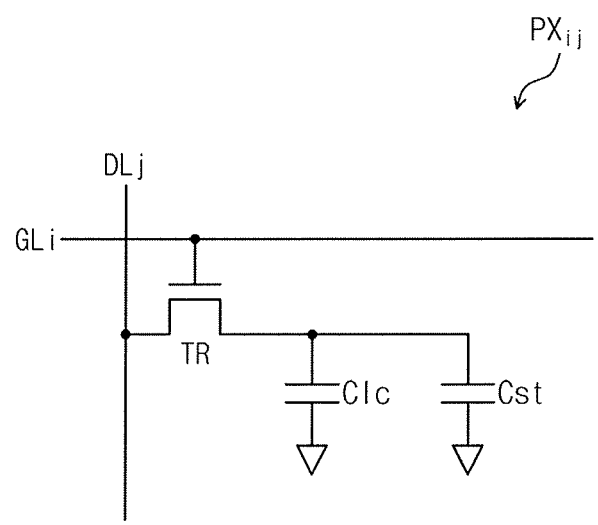
FIG. 3 is a circuit diagram showing a pixel according to an exemplary embodiment of the present inventive concept.
Figure 4:
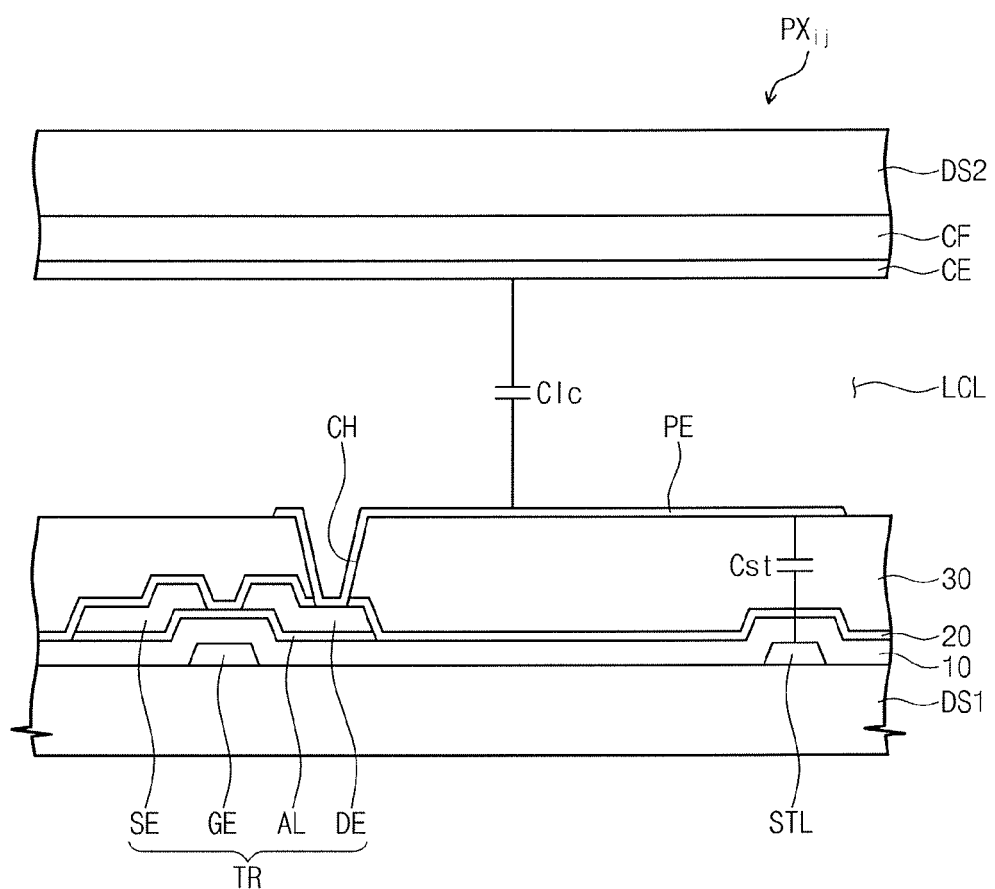
FIG. 4 is a cross-sectional view showing a pixel according to an exemplary embodiment of the present inventive concept.

FIG. 3 is a circuit diagram showing a pixel according to an exemplary embodiment of the present inventive concept, and FIG. 4 is a cross-sectional view showing a pixel according to an exemplary embodiment of the present inventive concept. Each of the pixels $PX_{11}$ to $PX_{nm}$ shown in FIG. 1 may have substantially the same circuit diagram as that shown in FIG. 3.

Referring to FIG. 3, the pixel PXij (here, i is an integer that is equal to or greater than 1, and equal to or smaller than n, and j is an integer that is equal to or greater than 1, and equal to or smaller than m) includes a pixel thin film transistor TR (hereinafter, referred to as a pixel transistor), a liquid crystal capacitor Clc, and a storage capacitor Cst. Hereinafter, the term of "transistor" may be understood to mean a thin film transistor, and the storage capacitor Cst may be omitted.

The pixel transistor TR of the pixel PXij is electrically connected to an i-th gate line GLi and a j-th data line DLj. The pixel transistor TR outputs a pixel voltage corresponding to the data signal provided from the j-th data line DLj in response to the gate signal provided from the i-th gate line GLi.

The liquid crystal capacitor Clc is charged with the pixel voltage output from the pixel transistor TR. An alignment of liquid crystal directors included in the liquid crystal layer LCL (refer to FIG. 4) is changed in accordance with an amount of electric charges charged in the liquid crystal capacitor Clc. Light incident to the liquid crystal layer LCL transmits through or is blocked by the alignment of the liquid crystal directors.

The storage capacitor Cst is connected to the liquid crystal capacitor Clc in parallel. The storage capacitor Cst maintains the alignment of the liquid crystal directors for a predetermined period.

Referring to FIG. 4, the pixel transistor TR includes a control electrode GE connected to the i-th gate line GLi (refer to FIG. 3), an active part AL overlapping the control electrode GE, an input electrode SE connected to the j-th data line DLj (refer to FIG. 3), and an output electrode DE disposed to be spaced apart from the input electrode SE.

The liquid crystal capacitor Clc includes a pixel electrode PE and a common electrode CE. The storage capacitor Cst includes the pixel electrode PE and a portion of a storage line STL.

The i-th gate line GLi and the storage line STL are disposed on a surface of the first substrate DS1. The control electrode GE is branched from the i-th gate line GLi. The i-th gate line GLi and the storage line STL include a metal material, such as aluminum (Al), silver (Ag), copper (Cu), molybdenum (Mo), chromium (Cr), tantalum (Ta), titanium (Ti), or the like, or an alloy thereof. Each of the i-th gate line GLi and the storage line STL has a multi-layer structure of a titanium layer and a copper layer.

A first insulating layer 10 is disposed on the first substrate DS1 to cover the control electrode GE and the storage line STL. The first insulating layer 10 includes at least one of an inorganic material and an organic material. The first insulating layer 10 is an organic layer. In an exemplary embodiment, the first insulting layer 10 may be an inorganic layer. The first insulating layer 10 has a multi-layer structure of a silicon nitride layer and a silicon oxide layer.

The active part AL is disposed on the first insulating layer 10 to overlap the control electrode GE. The active part AL may include a semiconductor layer and an ohmic contact layer. The semiconductor layer may be disposed on the first insulating layer 10, and the ohmic contact layer may be disposed on the semiconductor layer.

The semiconductor layer may include amorphous silicon, polysilicon, or the like. In addition, the semiconductor layer may include a metal oxide semiconductor. The ohmic contact layer may highly be doped with a dopant different than the semiconductor layer. The ohmic contact layer may include two portions spaced apart from each other. In an exemplary embodiment, the ohmic contact layer may integrally be formed in a single unit.

The output electrode DE and the input electrode SE of the transistor TR are disposed on the active part AL. The output electrode DE and the input electrode SE are spaced apart from each other. Each of the output electrode DE and the input electrode SE partially overlaps the control electrode GE.

For example, the output electrode DE and the input electrode SE are disposed on the active part AL. When viewed in a plan view, the output electrode DE overlaps one portion of the active part AL and the input electrode SE overlaps another portion of the active part AL.

A second insulating layer 20 is disposed on the first insulating layer 10 to cover the active part AL, the output electrode DE, and the input electrode SE. The second insulating layer 20 includes at least one of an inorganic or organic material. The second insulating layer 20 is an organic layer. In an exemplary embodiment, the second insulating layer may be an inorganic layer. The second insulating layer 20 has a multi-layer structure of a silicon nitride layer and a silicon oxide layer.

FIG. 1 shows the pixel transistor TR having a staggered structure, but the structure of the pixel transistor TR is not limited to the staggered structure. For example, the pixel transistor TR may have a planar structure.

A third insulating layer 30 is disposed on the second insulating layer 20. The third insulating layer 30 is provided to an even surface. The third insulating layer 30 includes an organic material.

The pixel electrode PE is disposed on the third insulating layer 30. The pixel electrode PE is connected to the output electrode DE through a contact hole CH formed through the second and third insulating layer 20 and 30. An alignment layer is disposed on the third insulating layer 20 to cover the pixel electrode PE.

A color filter layer CF is disposed on a surface of the second substrate DS2. The common electrode CE is disposed on the color filter layer CF. The common electrode CE is applied with a common voltage. The common voltage has a level different from that of the pixel voltage. An alignment layer may be disposed on the common electrode CE to cover the common electrode CE. An insulating layer may be disposed between the color filter layer CF and the common electrode CE.

The pixel electrode PE and the common electrode CE, which face each other such that the liquid crystal layer LCL is disposed between the pixel electrode PE and the common electrode CE, form the liquid crystal capacitor Clc. In addition, the pixel electrode PE and the portion of the storage line STL, which face each other such that the first, second, and third insulating layers 10, 20, and 30 are disposed between the pixel electrode PE and the portion of the storage line STL, form the storage capacitor Cst. A storage voltage having a level different from that of the pixel voltage is applied to the storage line STL. The storage voltage may have the same level as that of the common voltage.

In addition, at least one of the color filter layer CF and the common electrode CE may be disposed on the first substrate DS1. For example, the liquid crystal display panel according to an exemplary embodiment of the present inventive concept may include a vertical alignment (VA) mode pixel, a patterned vertical alignment (PVA) mode pixel, an in-plane switching (IPS) mode pixel, a fringe-field switching (FFS) mode pixel, a plane-to-line switching (PLS) mode pixel, or the like.

Figure 5:
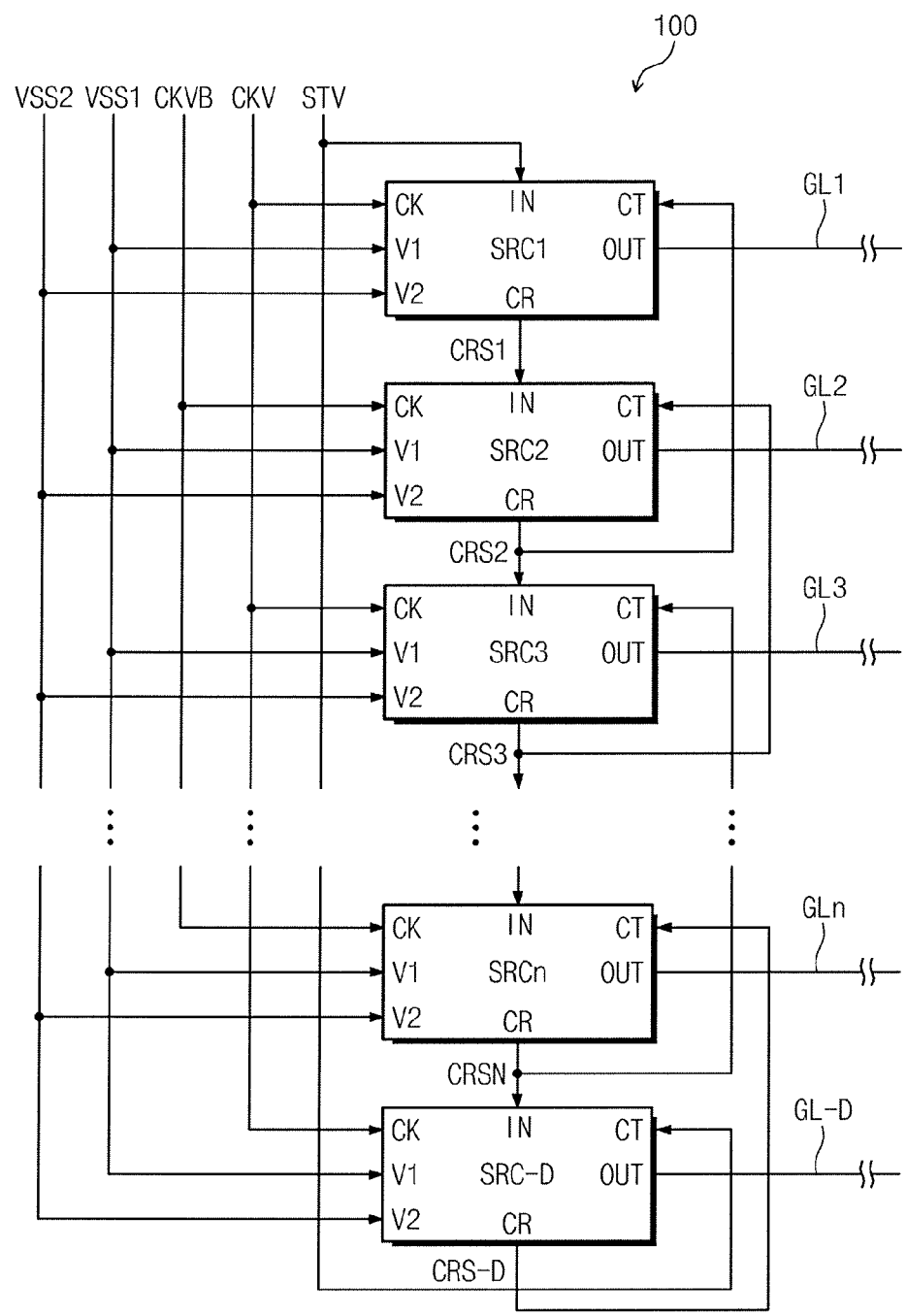
FIG. 5 is a block diagram showing a gate driving circuit according to an exemplary embodiment of the present inventive concept.

FIG. 5 is a block diagram showing a gate driving circuit according to an exemplary embodiment of the present inventive concept. Referring to FIG. 5, the gate driving circuit 100 includes a plurality of driving stages SRC1 to SRCn connected to one after another.

In an exemplary embodiment, the driving stages SRC1 to SRCn are connected to the gate lines GL1 to GLn, respectively. The driving stages SRC1 to SRCn apply the gate signals to the gate lines GL1 to GLn, respectively. In an exemplary embodiment, odd-numbered gate lines or even-numbered gate lines among the gate lines may be connected to the driving stages SRC to SRCn.

The gate driving circuit 100 may further include a dummy stage SRC-D and a dummy gate line GL-D. The dummy stage SRC-D is connected to the last driving stage SRCn among the driving stages SRC1 to SRCn. The dummy stage SRC-D is connected to the dummy gate line GL-D.

Each of the driving stages SRC1 to SRCn includes an output terminal OUT, a carry terminal CR, an input terminal IN, a control terminal CT, a clock terminal CK, a first voltage input terminal V1, and a second voltage input terminal V2.

The output terminal OUT of each of the driving stages SRC1 to SRCn is connected to a corresponding gate line of the gate lines GL1 to GLn. The gate signals GS1 to GSn generated by the driving stages SRC1 to SRCn are applied to the gate lines GL1 to GLn, respectively, through the output terminals OUT.

The carry terminal CR of the k-th driving stage SRCk of the driving stages SRC1 to SRCn−1 is electrically connected to the input terminal IN of the (k+1)-th driving stage SRCk+1 following the k-th driving stage SRCk. Here, k is an integer that is equal to or greater than 1, and equal to or smaller than n−1. The carry terminals CR of the driving stages SRC1 to SRCn output carry signals CRS1 to CRSn, respectively. For example, the carry terminal CR of the n-th driving stage SRCn may electrically be connected to the input terminal IN of the dummy stage SRC-D, and the carry terminal CR of the dummy stage SRC-D may output a carry signal CRS-D.

The input terminal IN of the first driving stage SRC1 of the driving stages SRC1 to SRCn receives a start signal STV that starts an operation of the gate driving circuit 100. The input terminal IN of the p-th driving stage SRCp of the driving stages SRC1 to SRCn receives the carry signal CRSp−1 output from the (p−1)-th driving stage SRCp−1 preceding the p-th driving stage SRCp. Here, p is an integer that is equal to or greater than 2, and equal to or smaller than n. For example, the input terminal IN of the third driving stage SRC3 receives the carry signal CRS2 output from the second driving stage SRC2. The input terminal IN of the dummy stage SRC-D may receive the carry signal CRSn output from the n-th driving stage SRCn.

The control terminal CT of the q-th driving stage SRCq of the driving stages SRC1 to SRCn is electrically connected to the carry terminal CR of the (q+1)th stage driving stage SRCq+1 following the q-th driving stage SRCp. Here, q is an integer that is equal to or greater than 1, and equal to or smaller than n−1. The control terminal CT of the q-th driving stage SRCq receives the carry signal CRSq+1 of the (q+1)-th driving stage SRCq+1 following the q-th driving stage SRCq. For example, the control terminal CT of the second driving stage SRC2 receives the carry signal CRS3 output from the carry terminal CR of the third driving stage SRC3.

In an exemplary embodiment, the control terminal CT of the q-th driving stage SRCq may be electrically connected to the output terminal OUT of the (q+1)-th driving stage following the q-th driving stage.

The control terminal CT of the n-th driving stage SRCn is electrically connected to the carry terminal CR of the dummy stage SRC-D. The control terminal CT of the n-th driving stage SRCn receives the carry signal CRS-D output from the carry terminal CR of the dummy stage SRC-D. The control terminal CT of the dummy stage SRC-D receives the start signal STV.

The clock terminal CK of each of the driving stages SRC1 to SRCn receives a first clock signal CKV or a second clock signal CKVB. The clock terminals CK of the odd-numbered driving stages (e.g., SRC1, SRC3, SRCn−1, or the like) among the driving stages SRC1 to SRCn receive the first clock signal CKV. The clock terminals CK of the even-numbered driving stages (e.g., SRC2, SRC4, SRCn, or the like) among the driving stages SRC1 to SRCn receive the second clock signal CKVB. For example, the dummy driving stage SRC-D may receive the first clock signal CKV. A phase of the first clock signal CKV is different from a phase of the second clock signal CKVB.

The first voltage input terminal V1 of each of the driving stages SRC1 to SRCn receives a first discharge voltage VSS1, and the second voltage input terminal V2 of each of the driving stages SRC1 to SRCn receives a second discharge voltage VSS2. In an exemplary embodiment, the second discharge voltage VSS2 has a voltage level lower than that of the first discharge voltage VSS1.

In each of the driving stages SRC1 to SRCn according to an exemplary embodiment of the present inventive concept, at least one of the output terminal OUT, the input terminal IN, the carry terminal CR, the control terminal CT, the clock terminal CK, the first voltage input terminal V1, and the second voltage input terminal V2 may be omitted or another terminal may be added to each of the driving stages SRC1 to SRCn. For example, one of the first and second voltage input terminals V1 and V2 may be omitted. In addition, a connection relation between the driving stages SRC1 to SRCn may be changed.

Figure 6:
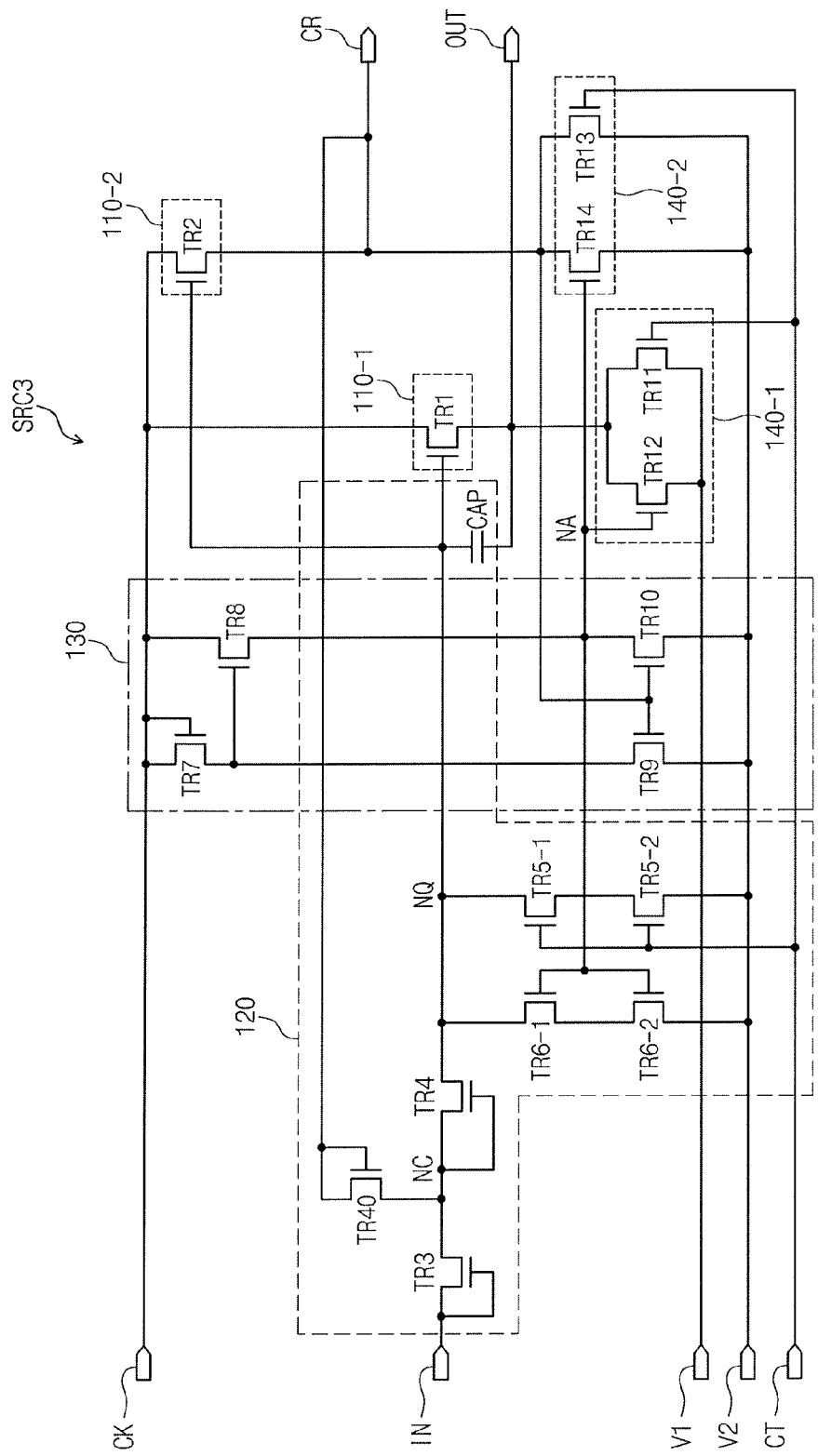
FIG. 6 is a circuit diagram showing a third driving stage of a gate driving circuit according to an exemplary embodiment of the present inventive concept.
Figure 7:
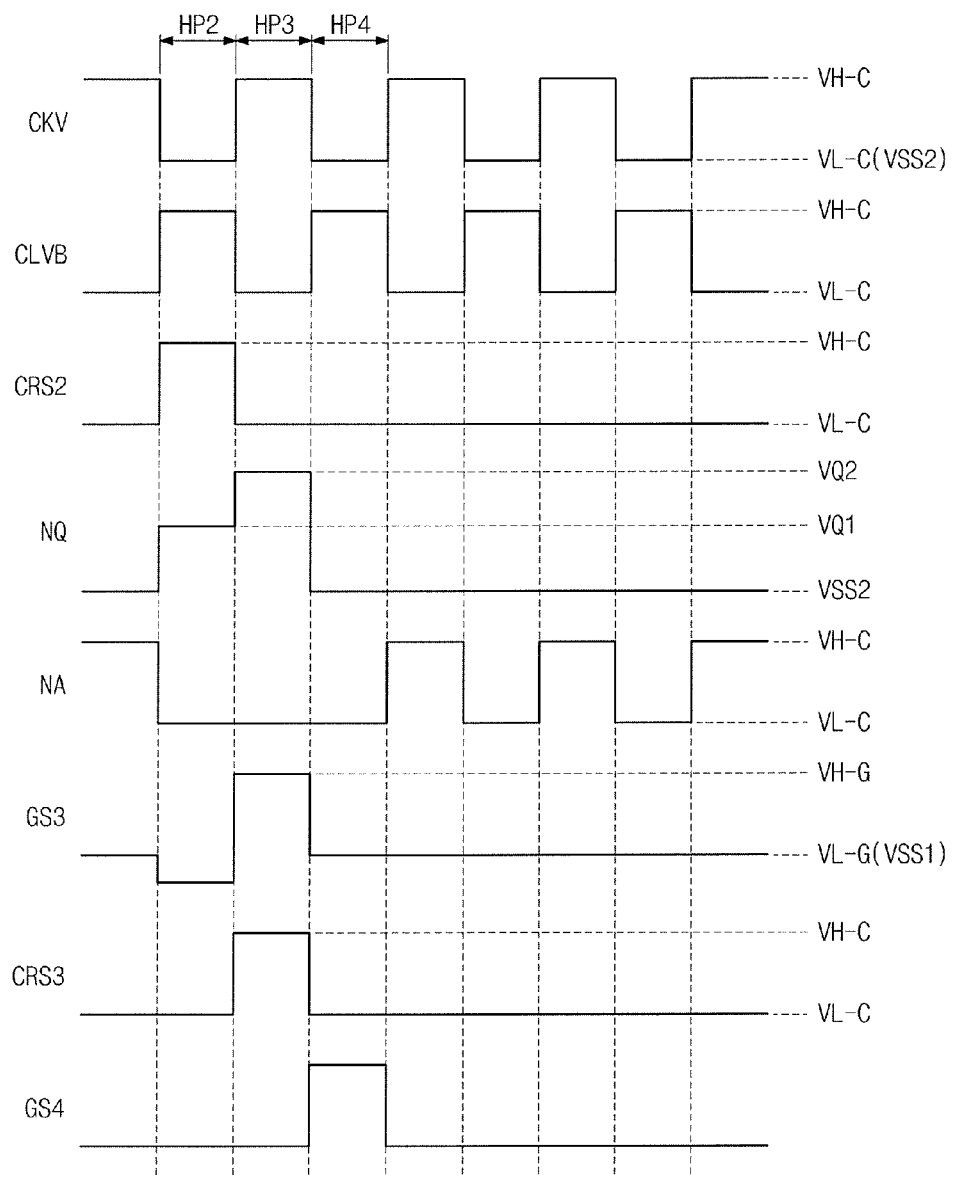
FIG. 7 is a waveform diagram of input and output signals of the third driving stage of FIG. 6 according to an exemplary embodiment of the present inventive concept.

FIG. 6 is a circuit diagram showing a third driving stage SRC3 of a gate driving circuit according to an exemplary embodiment of the present inventive concept, and FIG. 7 is a waveform diagram of input and output signals of the third driving stage SRC3 of FIG. 6 according to an exemplary embodiment of the present inventive concept. Each of the driving stages SRC1 to SRCn shown in FIG. 5 may have substantially the same circuit diagram as that of the third driving stage SRC3 of FIG. 6.

Referring to FIGS. 6 and 7, the third driving stage SRC3 includes output parts 110-1 and 110-2, a control part 120, an inverter part 130, and pull-down parts 140-1 and 140-2. The output parts 110-1 and 110-2 include a first output part 110-1 for outputting a third gate signal GS3 and a second output part 110-2 for outputting a third carry signal CRS3. The pull-down parts 140-1 and 140-2 include a first pull-down part 140-1 for lowering (e.g., pulling down) a voltage of the output terminal OUT and a second pull-down part 140-2 for lowering (e.g., pulling down) a voltage of the carry terminal CRT. The circuit diagram of the third driving stage SRC3 is not limited to the above-mentioned circuit diagram.

The first output part 110-1 includes a first output transistor TR1. The first output transistor TR1 includes an input electrode to which the first clock signal CKV is applied, a control electrode connected to a first node NQ, and an output electrode that outputs the third gate signal GS3.

The second output part 110-2 includes a second output transistor TR2. The second output transistor TR2 includes an input electrode to which the first clock signal CKV is applied, a control electrode connected to the first node NQ, and an output electrode that outputs the third carry signal CRS3.

As shown in FIG. 7, a phase of the first clock signal CKV is opposite to a phase of the second clock signal CKVB. For example, a phase of. the first clock signal CKV is different from a phase of the second clock signal CKVB by a phase of about 180 degrees. Each of the first and second clock signals CKV and CKVB includes logic low periods having low voltages VL-C and logic high periods having high voltages VH-C. In each of the first and second clock signals CKV and CKVB, the logic low periods and the logic high periods are alternately arranged with each other. For example, the high voltage VH-C is about 10 volts and the low voltage VL-C is about −16 volts. The low voltage VL-C has substantially the same level as that of the second discharge voltage VSS2 (refer to FIG. 5).

The third gate signal GS3 includes a logic low period having a low voltage VL-G and a logic high period having a high voltage VH-G. The low voltage VL-G of the third gate signal GS3 has substantially the same level as the first discharge voltage VSS1 (refer to FIG. 5). For example, the low voltage VL-G is about −13 volts. The third gate signal GS3 has substantially the same level as that of the low voltage VH-C (e.g., VSS2) of the first clock signal CKV during a period (e.g., HP2). The high voltage VH-G of the third gate signal GS3 may have substantially the same level as that of the high voltage VH-C. The third carry signal CRS3 includes a logic low period having a low voltage VL-C and a logic high period having a high voltage VH-C. The third carry signal CRS3 is generated on the basis of the first clock signal CKV, and thus the low and high voltages VL-C and VH-C of the third carry signal CRS3 may be substantially the same as or similar to those of the first clock signal CKV, respectively.

Referring to FIGS. 6 and 7, the control part 120 controls an operation of the first and second output parts 110-1 and 110-2. The control part 120 turns on the transistors TR1 and TR2 of the first and second output parts 110-1 and 110-2 in response to the second carry signal CRS2. The second carry signal CRS2 is output from the second driving stage SRC2 and is input through the input terminal IN of the third driving stage SRC3. In addition, the control part 120 turns off the transistors TR1 and TR2 of the first and second output parts 110-1 and 110-2 in response to the fourth carry signal CRS4 output from the fourth driving stage SRC4. The control part 120 maintains the turned-off state of the transistor TR1 and TR2 of the first and second output parts 110-1 and 110-2 in response to the switching signal output from the inverter part 130.

The control part 120 includes a first control transistor TR3, a second control transistor TR4, a third control transistor TR40, fourth control transistors TR5-1 and TR5-2, fifth control transistors TR6-1 and TR6-2, and a capacitor CAP. In an exemplary embodiment, the two fourth control transistors TR5-1 and TR5-2 are connected to each other in series and the two fifth control transistors TR6-1 and TR6-2 are connected to each other in series. Before the third gate signal GS3 is activated (e.g., in a logic high period), the first control transistor TR3 applies a first control signal to a second node NC to control an electric potential (e.g., a voltage) of the first node NQ. FIG. 7 shows second to fourth horizontal periods HP2, HP3, and HP4. Each of the horizontal periods HP2, HP3, and HP4 corresponds to a period in which each of the second, third, fourth gate signals GS2, GS3, and GS4 is activated (e.g., in a logic high period). The third horizontal period HP3 is subsequent to the second horizontal period HP2, and the fourth horizontal period HP4 is subsequent to the third horizontal period HP3.

The first control transistor TR3 includes an output electrode connected to the second node NC, and a control electrode and an input electrode commonly connected to the input terminal of the third driving stage SRC3 to receive the second carry signal CRS2 output from the second driving stage SRC2. In an exemplary embodiment, the first control signal may be the second carry signal CRS2. In an exemplary embodiment, the first control transistor TR3 may be replaced with a first diode which includes an anode connected to the input terminal of the third driving stage SRC3 to receive the second carry signal CRS2 and a cathode connected to the second node NC.

The second control transistor TR4 is diode-connected between the second node NC and the first node NQ such that a current path is formed between the second node NC and the first node NQ. The second control transistor TR4 includes an output electrode connected to the first node NQ, and a control electrode and an input electrode, which are commonly connected to the second node NC. In an exemplary embodiment, the second control transistor TR4 may be replaced with a second diode connected between the second node NC and the first node NQ such that a current path is formed between the second node NC and the first node NQ. The second diode may include an anode connected to the second node NC and a cathode connected to the first node NQ.

After the second carry signal CRS2 is applied to the second node NC, a second control signal is applied to the second node NC. The second control signal may be a signal synchronized with the third gate signal GS3. Here, the term of "the second control signal is synchronized with the third gate signal GS3" may be understood to mean that the second control signal has a logic high voltage at the same time point as that of the third gate signal GS3.

The third control transistor TR40 applies the second control signal to the second node NC. The third control transistor TR40 is diode-connected between the output electrode of the second output transistor TR2 and the second node NC such that a current path is formed between the output electrode of the second output transistor TR2 and the second node NC. The third control transistor TR40 includes an output electrode connected to the second node NC, and a control electrode and an input electrode, which are commonly connected to the output electrode of the second output transistor TR2. In an exemplary embodiment, the third control transistor TR40 may be replaced with a third diode. The third diode may apply the second control signal to the second node NC. The third diode may be connected between the output electrode of the second output transistor TR2 and the second node NC such that a current path is formed between the output electrode of the second output transistor TR2 and the second node NC. The third diode may include an anode connected to the output electrode of the second output transistor TR and a cathode connected to the second node NC.

The second control signal may be substantially the same as the second carry signal CRS2. In an exemplary embodiment, the third control transistor TR40 may be diode-connected between the output electrode of the first output transistor TR1 and the second node NC. In this case, the second control signal may be substantially the same as the third gate signal GS3. For example, the third control transistor TR40 may apply the substantially same signal as the third gate signal GS3 to the second node NC as the second control signal.

The capacitor CAP is connected between the output electrode of the first output transistor TR1 and the control electrode (or the first node NQ) of the first output transistor TR1.

The two fourth control transistors TR5-1 and TR5-2 are connected between the second voltage input terminal V2 and the first node NQ in series. Control electrodes of the fourth control transistors TR5-1 and TR5-2 are commonly connected to the control terminal CT. The fourth control transistors TR5-1 and TR5-2 apply the second discharge voltage VSS2 to the first node NQ in response to the fourth carry signal CRS4 output from the fourth driving stage. In an exemplary embodiment, the two fourth control transistors TR5-1 and TR5-2 may be turned on by the fourth gate signal GS4.

The two fifth control transistors TR6-1 and TR6-2 are connected between the second voltage input terminal V2 and the first node NQ in series. Control electrodes of the fifth control transistors TR6-1 and TR6-2 are commonly connected to a third node NA. The fifth control transistors TR6-1 and TR6-2 apply the second discharge voltage VSS2 to the first node NQ in response to the switching signal output from the inverter part 130.

In an exemplary embodiment, one of the two fourth control transistors TR5-1 and TR5-2 may be omitted and one of the two fifth control transistors TR6-1 and TR6-2 may be omitted. In an exemplary embodiment, the fourth control transistors TR5-1 and TR5-2 or the fifth control transistors TR6-1 and TR6-2 may be connected to the first voltage input terminal V1.

As shown in FIG. 7, the electric potential (e.g., voltage) of the first node NQ increases to a first high voltage VQ1 by the second carry signal CRS2 during the second horizontal period HP2. When the second carry signal CRS2 is applied to the first node NQ, the capacitor CAP is charged with a voltage corresponding to the second carry signal CRS2. The third gate signal GS3 is output during the third horizontal period HP3. In this case, the voltage of the first node NQ is boosted to a second high voltage VQ2 from the first high voltage VQ1.

Since the second control signal is applied to the second node NC, a drain-source voltage of each of the first and second control transistors TR3 and TR4 is reduced during the third horizontal period HP3. This will be described in detail with reference to FIGS. 8 to 10.

The voltage of the first node NQ decreases to the second discharge voltage VSS2 during the fourth horizontal period HP4. Accordingly, the first and second output transistors TR1 and TR2 are turned off. After the fourth horizontal period HP4, the voltage of the first node NQ is maintained in the second discharge voltage VSS2 until the third gate signal GS3 is activated (e.g., in a logic high period) in a next frame period. Therefore, the turned-off stage of the first and second output transistors TR1 and TR2 is maintained during the time period after the fourth horizontal period HP4 and before the third gate signal GS3 of the next frame period is activated.

Referring to FIGS. 6 and 7, the inverter part 130 outputs the switching signal to the third node NA. The inverter part 130 includes first, second, third, and fourth inverter transistors TR7, TR8, TR9, and TR10. The first inverter transistor TR7 includes an input electrode and a control electrode commonly connected to the clock terminal CK, and an output electrode connected to a control electrode of the second inverter transistor TR8. The second inverter transistor TR8 includes an input electrode connected to the clock terminal CK and an output electrode connected to the third node NA.

The third inverter transistor TR9 includes an output electrode connected to the output electrode of the first inverter transistor TR7, a control electrode connected to the carry terminal CR, and an input electrode connected to the second voltage input terminal V2. The fourth inverter transistor TR10 includes an output electrode connected to the third node NA, a control electrode connected to the carry terminal CR, and an input electrode connected to the second voltage input terminal V2. In an exemplary embodiment, the control electrodes of the third and fourth inverter transistors TR9 and TR10 may be connected to the output terminal OUT, and the output electrodes of the third and fourth inverter transistors TR9 and TR10 may be connected to the first voltage input terminal V1.

As shown in FIG. 7, a signal of the third node NA has substantially the same waveform (e.g., phase) as that of the first clock signal CKV except for the waveform in the third horizontal period HP3. During the third horizontal period HP3, the third and fourth inverter transistors TR9 and TR10 are turned on in response to the third carry signal CRS3. In this case, the high voltage VH-C of the first clock signal CKV output from the second inverter transistor TR8 is discharged to the second discharge voltage VSS2. During the periods except for the third horizontal period HP3, the high voltage VH-C and the low voltage VL-C of the first clock signal CKV output from the second inverter transistor TR8 are applied to the third node NA. The high voltage VH-C and the low voltage VL-C are applied to the third node NA in an alternate manner and are provided to other transistors (e.g., TR12, TR6-1, TR6-2) as the switching signal.

The first pull-down part 140-1 includes a first pull-down transistor TR11 and a second pull-down transistor TR12. The first pull-down transistor TR11 includes an input electrode connected to the first voltage input terminal V1, a control electrode connected to the control terminal CT, and an output electrode connected to the output electrode of the first output transistor TR1. The second pull-down transistor TR12 includes an input electrode connected to the first voltage input terminal V1, a control electrode connected to the third node NA, and an output electrode connected to the output electrode of the first output transistor TR1. In an exemplary embodiment, at least one of the input electrode of the first pull-down transistor TR11 and the input electrode of the second pull-down transistor TR12 may be connected to the second voltage input terminal V2.

As shown in FIG. 7, the voltage of the third gate signal GS3 corresponds to the voltage of the output electrode of the first output transistor TR1. The first pull-down transistor TR11 applies the first discharge voltage VSS1 to the output electrode of the first output transistor TR1 in response to the fourth carry signal CRS4 during the fourth horizontal period HP4. After the fourth horizontal period HP4, the second pull-down transistor TR12 applies the first discharge voltage VSS1 to the output electrode of the first output transistor TR1 in response to the switching signal output from the third node NA.

The second pull-down part 140-2 includes a third pull-down transistor TR13 and a fourth pull-down transistor TR14. The third pull-down transistor TR13 includes an input electrode connected to the second voltage input terminal V2, a control electrode connected to the control terminal CT, and an output electrode connected to the output electrode of the second output transistor TR2. The fourth pull-down transistor TR14 includes an input electrode connected to the second voltage input terminal V2, a control electrode connected to the third node NA, and an output electrode connected to the output electrode of the second output transistor TR2. In an exemplary embodiment, at least one of the input electrode of the third pull-down transistor TR13 and the input electrode of the fourth pull-down transistor TR14 may be connected to the first voltage input terminal V1.

As shown in FIG. 7, the voltage of the third carry signal CRS3 corresponds to the voltage of the output electrode of the second output transistor TR2. The third pull-down transistor TR13 applies the second discharge voltage VSS2 to the output electrode of the second output transistor TR2 in response to the fourth carry signal CRS4 during the fourth horizontal period HP4. After the fourth horizontal period HP4, the fourth pull-down transistor TR14 applies the second discharge voltage VSS2 to the output electrode of the second output transistor TR2 in response to the switching signal output from the third node NA.

Figure 8:
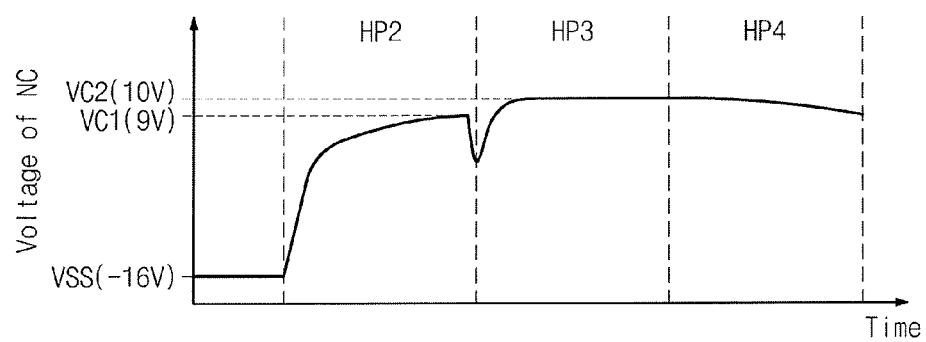
FIG. 8 is a waveform diagram showing a variation in voltage of a second node of the third driving stage shown in FIG. 6 according to an embodiment of the present inventive concept.
Figure 9:
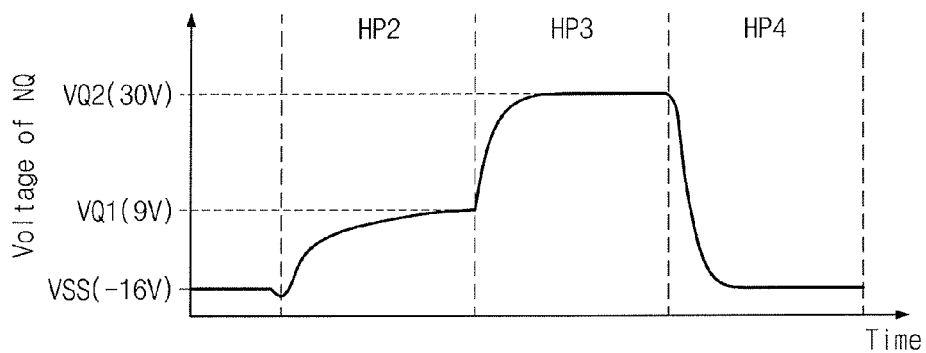
FIG. 9 is a waveform diagram showing a variation in voltage of a first node of the third driving stage shown in FIG. 6 according to an embodiment of the present inventive concept.
Figure 10:
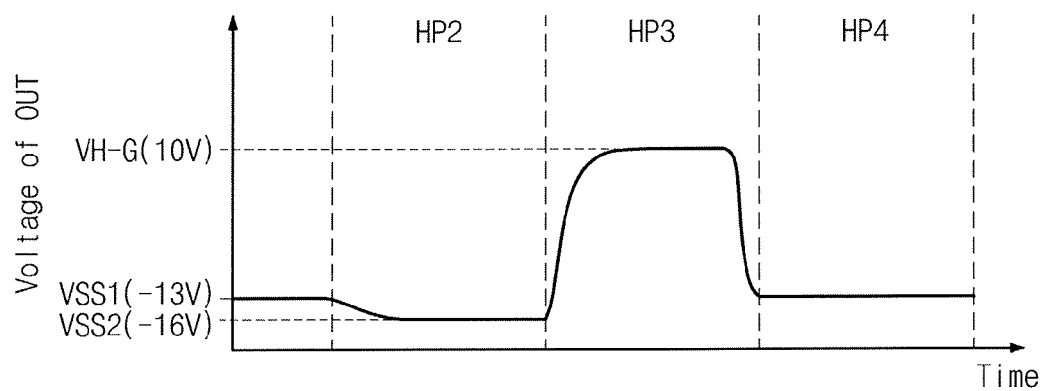
FIG. 10 is a waveform diagram showing a variation in voltage of an output terminal of the third driving stage shown in FIG. 6 according to an embodiment of the present inventive concept.

FIG. 8 is a waveform diagram showing a variation in voltage of a second node NC of the third driving stage SRC3 shown in FIG. 6 according to an exemplary embodiment of the present inventive concept, FIG. 9 is a waveform diagram showing a variation in voltage of a first node NQ of the third driving stage SRC3 shown in FIG. 6 according to an exemplary embodiment of the present inventive concept, and FIG. 10 is a waveform diagram showing a variation in voltage of an output terminal OUT of the third driving stage SRC3 shown in FIG. 6 according to an exemplary embodiment of the present inventive concept.

Referring to FIG. 8, the second node NC receives the second carry signal CRS2 through the first control transistor TR3 during the second horizontal period HP2, and thus the second node NC has a first high voltage VC1 (e.g., 9 volts) at a time of the second horizontal period HP2. The first high voltage VC1 has a voltage level substantially the same as or lower than that of the high voltage VH-C of the second carry signal CRS2.

Referring to FIG. 9, the first node NQ receives the voltage corresponding to the second carry signal CRS2 through the second control transistor TR4 during the second horizontal period HP2, and thus the second node NC has the first high voltage VQ1 (e.g., 9 volts) at a time of the second horizontal period HP2. The first high voltage VQ1 has a voltage level substantially the same as or lower than that of the first high voltage VC1 of the second node NC.

Referring to FIG. 10, the output terminal OUT has a voltage level substantially the same as the low voltage VL-C of the first clock signal CKV during the second horizontal period HP2. This is because the first output transistor TR1 is turned on in response to the first high voltage VQ1 of the first node NQ during the third horizontal period HP3.

As shown in FIG. 8, the second node NC receives the third carry signal CRS3 through the third control transistor TR40 during the third horizontal period HP3, and thus the second node NC increases to a second high voltage VC2 (e.g., 10 volts) during the third horizontal period HP3. The second high voltage VC2 has a voltage level substantially the same as or lower than that of the high voltage VH-C of the third carry signal CRS3. In FIG. 8, the second high voltage VC2 of the second node NC is slightly higher than the first high voltage VC1 of the second node NC. The voltage levels of the first and second high voltages VC1 and VC2 of the second node NC may be changed in accordance with characteristics of the first and third control transistors TR1 and TR3.

As shown in FIG. 9, the first node NQ has the second high voltage VQ2 during the third horizontal period HP3. For example, the second high voltage VQ2 of the first node NQ is about 30 volts. In this case, the second high voltage VC2 of the second node NC may be about 10 volts during the third horizontal period HP3, as shown in FIG. 10. In addition, the input terminal IN may have about −16 volts corresponding to the low voltage VL-C of the second carry signal CRS2.

A voltage level or a current flowing direction between the input and output electrodes of each of the first and third control transistors TR3 and TR40 may be changed during the third horizontal period HP3. During the third horizontal period HP3, a drain-source voltage of, e.g., about 26 volts may be formed between the input and output electrodes of the first control transistor TR3, and a drain-source voltage of, e.g., about 20 volts may be formed between the input and output electrodes of the third control transistor TR40

In a comparison example in which the third control transistor TR40 is omitted, a drain-source voltage of, e.g., about 46 volts is formed between the input and output electrodes of the second control transistor TR4. When the drain-source voltage of, e.g., about 46 volts is formed between the input and output electrodes of the second control transistor TR4 during the third horizontal period HP3, the second control transistor TR4 may be burnt or may deteriorate. In addition, in a comparison example in which the third control transistor TR40 is omitted, an off leakage current flowing from the first node NQ to the second node NC occurs through the second control transistor TR4 During the third horizontal period HP3. The off leakage current decreases the voltage of the first node NQ and to delay the third gate signal GS3 and the third carry signal CRS3.

According to a comparison example in which the second and third control transistors TR4 and TR40 are omitted, a drain-source voltage of, e.g., about 46 volts is formed between the input and output electrodes of the first control transistor TR3. When the drain-source voltage of, e.g., about 46 volts is formed between the input and output electrodes of the first control transistor TR3 during the third horizontal period HP3, the first control transistor TR3 may be burnt or may deteriorate. Accordingly, a response time of the first control transistor TR3 is delayed, and thus defects occur in circuits of a driving stage.

According to an exemplary embodiment of the present inventive concept, the drain-source voltage, which is relatively low, is formed in the first and third control transistors TR3 and TR40. Accordingly, the first and second control transistors TR3 and TR4 are prevented from being degraded. When the off leakage current of the first and second control transistors TR3 and TR4 is reduced, the voltage of the first node NQ, which is connected to the control electrode of the first output transistor TR1, is maintained in a reference level (e.g., a desired level). Therefore, the third gate signal GS3 and the third carry signal CRS3 are not delayed.

In addition, the term of "the off leakage current occurs" may be understood to mean that a voltage level and a current flowing direction between the input and output electrodes of the transistor varies in accordance with a time lapse, and thus the transistor is degraded. A thin film transistor including a metal oxide semiconductor is vulnerable to the degradation. According to an exemplary embodiment of the present inventive concept, although the first control transistor TR3 and the transistors (e.g., TR4, TR5-1, TR6-1, and TR TR40) connected to the first node NQ or the second node NC include the metal oxide semiconductor, the transistors are prevented from being degraded since the control signal for controlling a voltage of the first node NQ is applied to the second node NC.

Referring to FIG. 8, the voltage of the second node NC is discharged during the horizontal periods (e.g., the fourth horizontal period HP4) following the third horizontal period HP3. Referring to FIGS. 9 and 10, during the horizontal periods (e.g., the fourth horizontal period HP4) following the third horizontal period HP3, the voltage of the first node NQ is discharged to the second discharge voltage VSS2 and the voltage of the output terminal OUT is discharged to the first discharge voltage VSS1.

Figure 11:
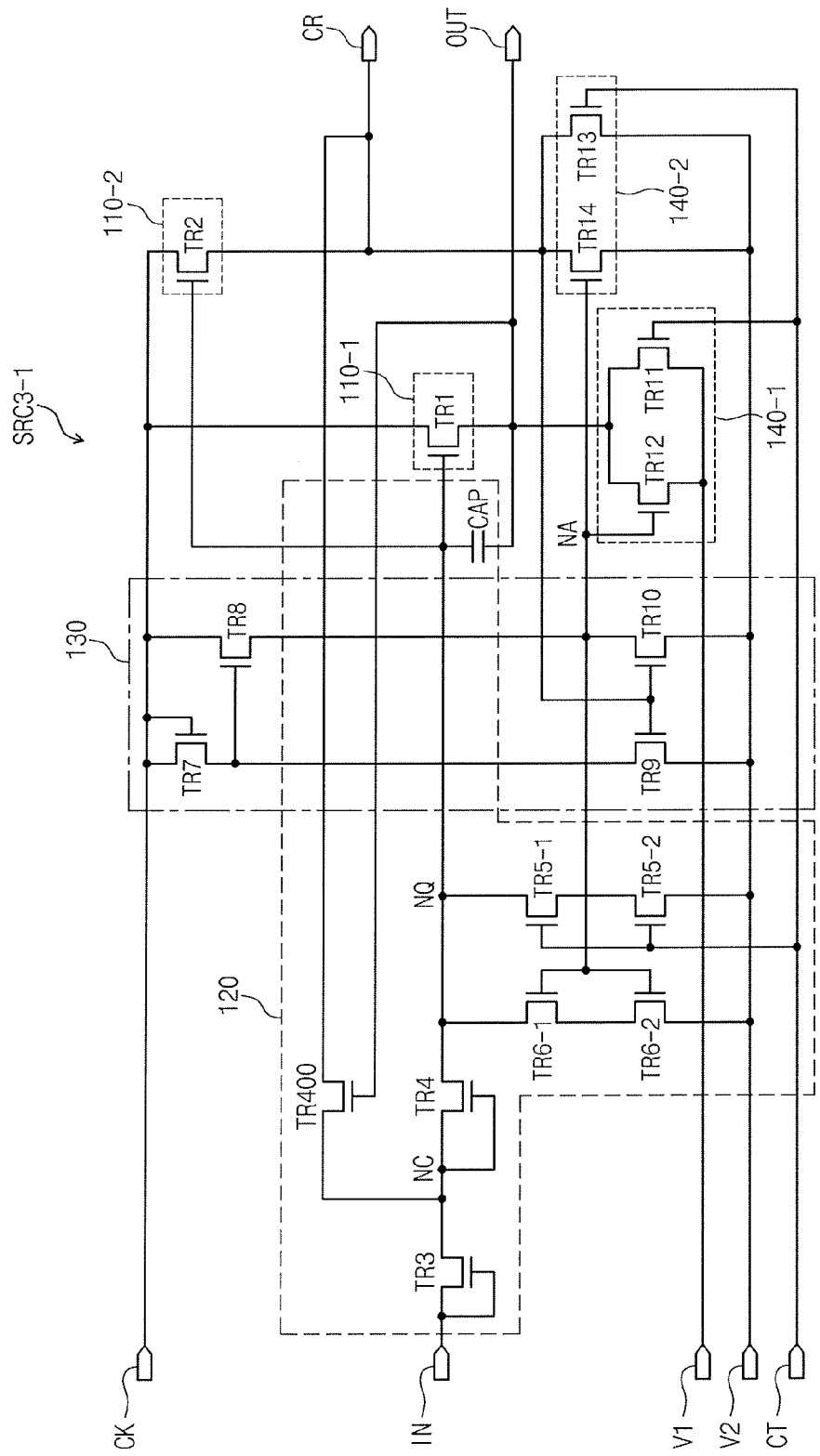
FIG. 11 is a circuit diagram showing a third driving stage of a gate driving circuit according to an exemplary embodiment of the present inventive concept.

FIG. 11 is a circuit diagram showing a third driving stage SRC3-1 of a gate driving circuit according to an exemplary embodiment of the present inventive concept. The third driving stage SRC3-1 shown in FIG. 11 has the same structure and function as those of the third driving stage SRC3 shown in FIG. 6 except for a third control transistor TR400.

Referring to FIG. 11, the third control transistor TR400 includes an output electrode connected to the second node NC, an input electrode connected to the carry terminal CR, and a control electrode connected to the output terminal OUT. The third control transistor TR400 applies the third carry signal CRS3 to the second node NC in response to the third gate signal GS3 during the third horizontal period HP3. Accordingly, the off leakage current of the first and second control transistors TR3 and TR4 is reduced during the third horizontal period HP3.

In an exemplary embodiment, the input electrode of the third control transistor TR400 may be connected to the output terminal OUT and the control electrode of the third control transistor TR400 may be connected to the carry terminal CR.

Figure 12:
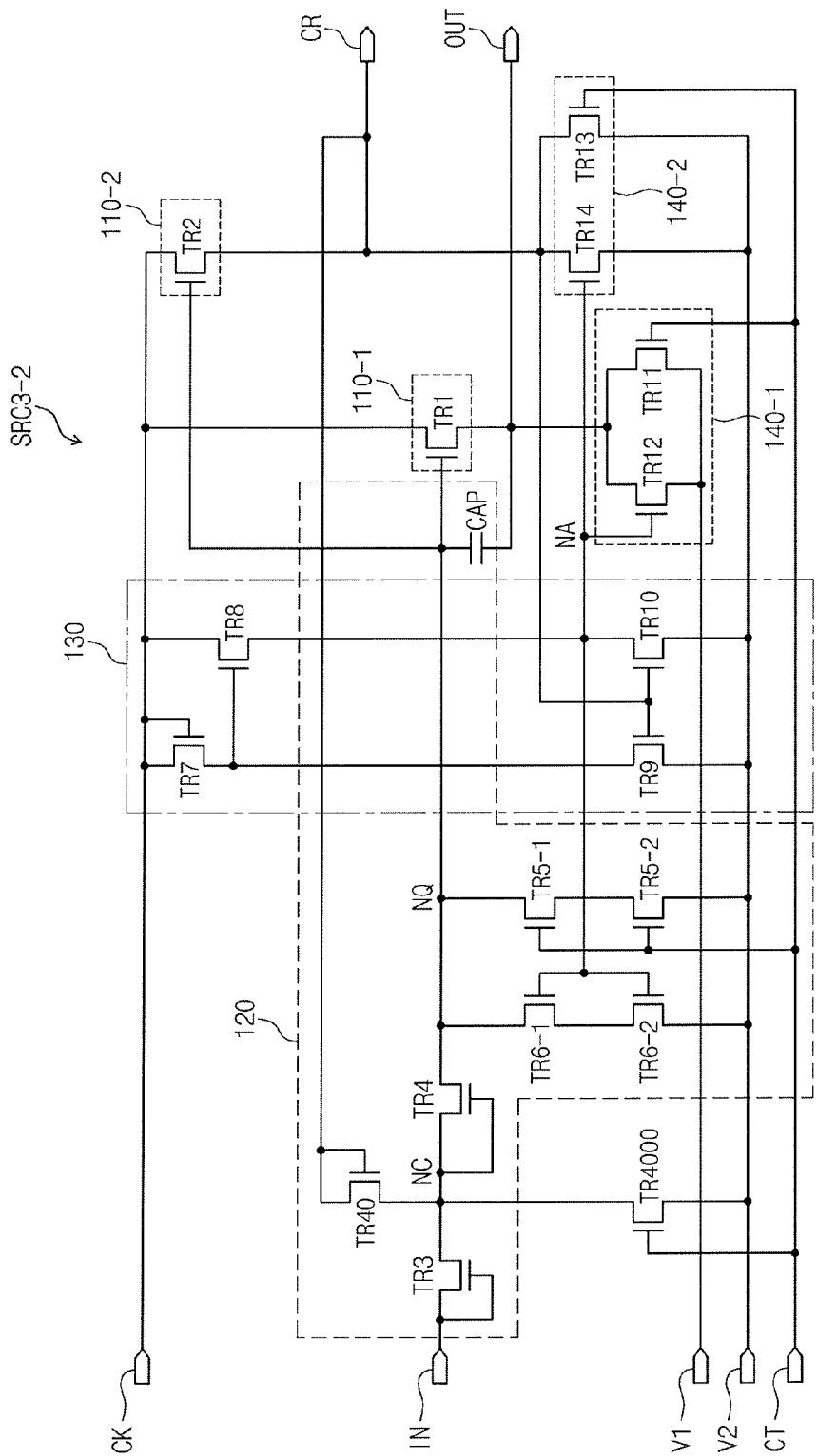
FIG. 12 is a circuit diagram showing a third driving stage of a gate driving circuit according to an exemplary embodiment of the present inventive concept.
Figure 13:
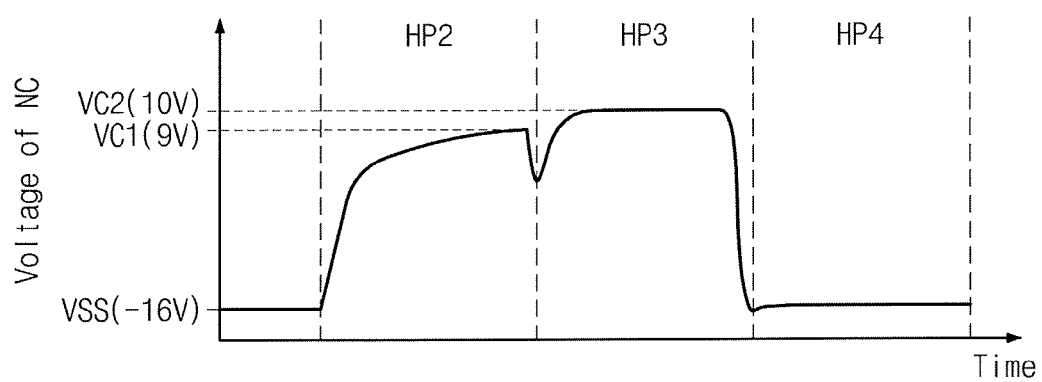
FIG. 13 is a waveform diagram showing a variation in voltage of a second node of the third driving stage shown in FIG. 12 according to an embodiment of the present inventive concept.

FIG. 12 is a circuit diagram showing a third driving stage SRC3-2 of a gate driving circuit according to an exemplary embodiment of the present inventive concept, and FIG. 13 is a waveform diagram showing a variation in voltage of a second node NC of the third driving stage SRC3-2 shown in FIG. 12 according to an exemplary embodiment of the present inventive concept.

According to an exemplary embodiment of the present inventive concept, the third driving stage SRC3-2 further includes a sixth control transistor TR4000 when compared to the driving stage SRC3 shown in FIG. 6.

The sixth control transistor TR4000 includes an output electrode connected to the second node NC, an input electrode connected to the second voltage input terminal V2, and a control electrode connected to the control terminal CT. The sixth control transistor TR4000 applies the second discharge voltage VSS2 to the second node NC in response to the fourth carry signal CRS4 during the fourth horizontal period HP4.

In an exemplary embodiment, the sixth control transistor TR4000 may be added to the driving stage SRC3-1 shown in FIG. 11. For example, referring to FIG. 11, the sixth control transistor TR4000 includes an output electrode connected to the second node NC, an input electrode connected to the second voltage input terminal V2, and a control electrode connected to the control terminal CT.

Therefore, the input terminal IN, the second node NC, and the first node NQ have substantially the same voltage during the fourth horizontal period HP4. For example, the input terminal IN, the second node NC, and the first node NQ have substantially the same voltage level as that of the second discharge voltage VSS2. During the fourth horizontal period HP4, the first and second control transistors TR3 and TR4 are prevented from being degraded.

Figure 14:
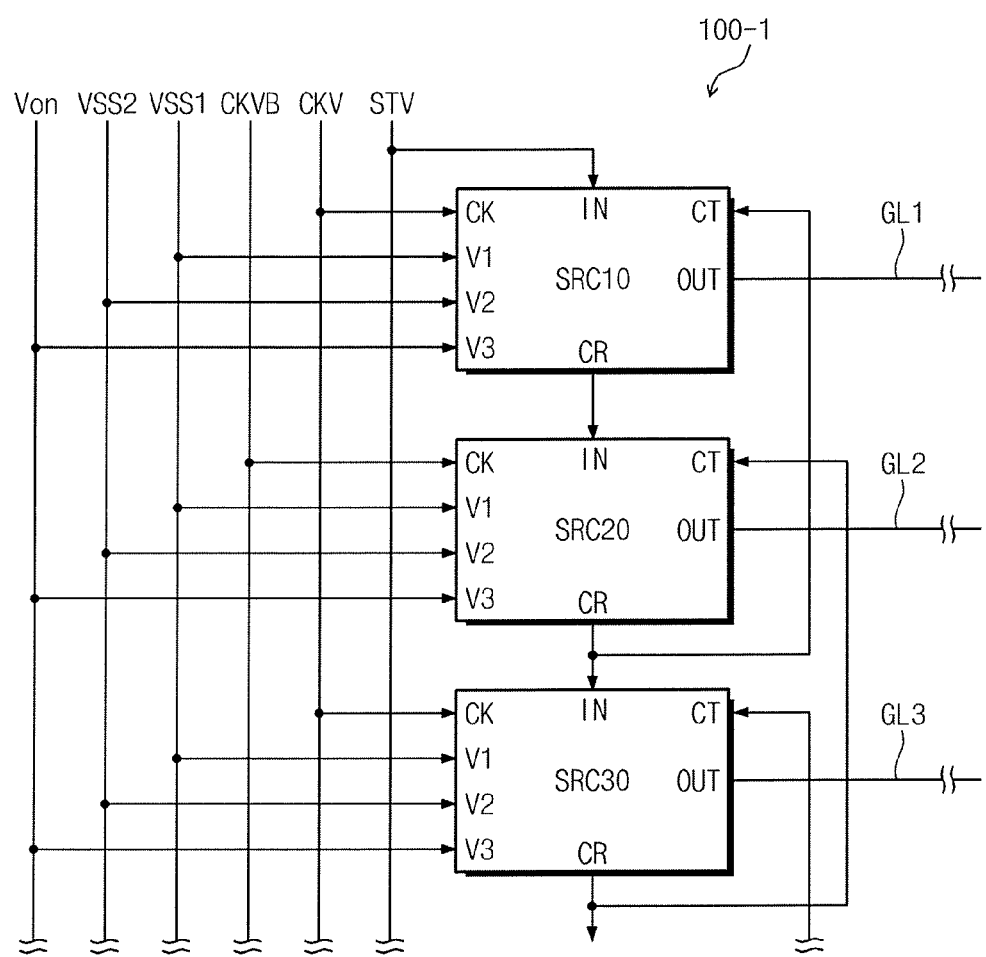
FIG. 14 is a block diagram showing a gate driving circuit according to an exemplary embodiment of the present inventive concept.
Figure 15:
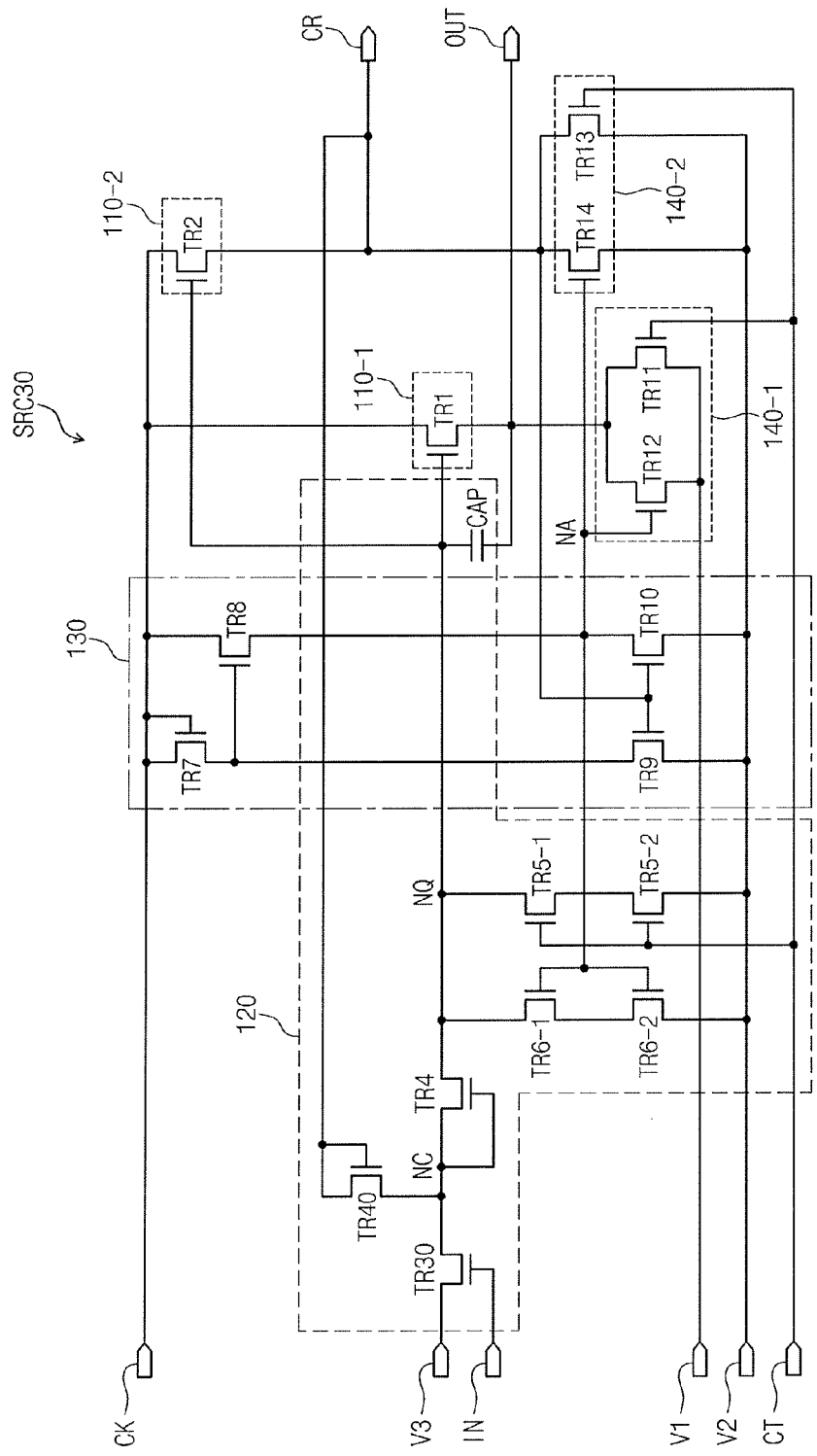
FIG. 15 is a circuit diagram showing a third driving stage of a gate driving circuit according to an exemplary embodiment of the present inventive concept.

FIG. 14 is a block diagram showing a gate driving circuit 100-1 according to an exemplary embodiment of the present inventive concept, and FIG. 15 is a circuit diagram showing a third driving stage SRC30 of a gate driving circuit according to an exemplary embodiment of the present inventive concept.

FIG. 14 shows three driving stages SRC10, SRC20, and SRC30 for illustration purpose. The three driving stages SRC10, SRC20, and SRC30 respectively correspond to the three driving stages SRC1, SRC2, and SRC3 shown in FIG. 5. Each of the three driving stages SRC10, SRC20, and SRC30 further include a third voltage input terminal V3 when compared to each of the driving stages SRC1, SRC2, and SRC3 shown in FIG. 5. Each of the driving stages SRC10 to SRC30 shown in FIG. 14 may have substantially the same structure as that of the third driving stage SRC30 of FIG. 15. In addition, the driving stage SRC30 has the same structure and function as those of the driving stage SRC3 shown in FIG. 6 except for a portion of a first control transistor TR30.

Referring to FIG. 15, the third voltage input terminal V3 receives a bias voltage Von. The first control transistor TR30 includes an output electrode connected to the second node NC, an input electrode connected to the third voltage input terminal V3, and a control electrode connected to the input terminal IN. The first control transistor TR30 applies the bias voltage Von received through the third voltage input terminal V3 to the second node NC in response to the second carry signal CRS2 output from the second driving stage SRC20 during the second horizontal period HP2.

The third control transistor TR40 applies the third carry signal CRS3 to the second node NC during the third horizontal period HP3. Thus, the first and second transistors TR30 and TR4 are prevented from being degraded during the third horizontal period HP3.

The input electrode of the first control transistor TR30 is biased to the high voltage VH-C of the second carry signal CRS2 (e.g., the high voltage VH-C of the first clock signal) regardless of the horizontal periods. The voltage of the input electrode of the first control transistor TR30 is equal to or greater than the voltage of the output electrode of the first control transistor TR30 (e.g., the voltage of the second node NC) during the third and fourth horizontal periods HP3 and HP4 and horizontal periods following the fourth horizontal period HP4. The current path (e.g., current flowing direction) of the first control transistor TR30 is not changed and the first control transistor TR30 is prevented from being degraded.

Although the present inventive concept has been described with exemplary embodiments thereof, it will be understood that the present inventive concept is not limited to exemplary embodiments set forth herein, and various changes in forms and details may be made therein without departing from the spirit and scope of the present inventive concept as defined in the appended claimed.

What is claimed is:

1. A gate driving circuit comprising;
   a plurality of driving stages, each of which applies a corresponding one of gate signals to a corresponding one of gate lines of a display panel,
   wherein a k-th (k is a natural number equal to or greater than 2) driving stage among the driving stages comprising:
   a first output transistor comprising a control electrode connected to a first node, an input electrode receiving a clock signal, and an output electrode outputting a k-th gate signal generated on the basis of the clock signal;
   a capacitor connected between the output electrode of the first output transistor and the control electrode of the first output transistor;
   a first control transistor applying a first control signal to a second node to control a voltage of the first node before the k-th gate signal is output;
   a second control transistor including input and control electrodes commonly connected to the second node, and an output electrode connected to the first node such that a current path is formed between the second node and the first node; and
   a second output transistor comprising a control electrode connected to the first node, an input electrode receiving the clock signal, and an output electrode outputting a k-th carry signal generated on the basis of the clock signal,
   wherein a second control signal synchronized with the k-th gate signal is applied to the second node after the first control signal is applied to the second node,
   wherein the second control signal corresponds to the k-th carry signal output from the k-th driving stage.

2. The gate driving circuit of claim 1, wherein the first control transistor comprises control and input electrodes commonly receiving a signal output from a (k−1)-th driving stage, and an output electrode outputting the first control signal.

3. The gate driving circuit of claim 2, wherein the signal output from the (k−1)-th driving stage corresponds to a (k−1)-th carry signal output from the (k−1)-th driving stage.

4. The gate driving circuit of claim 1, further comprising a third control transistor comprising control and input electrodes commonly receiving the k-th carry signal, and an output electrode outputting the second control signal.

5. The gate driving circuit of claim 1, further comprising a fourth control transistor applying a first discharge voltage to the first node such that the first output transistor is turned off after the k-th gate signal is output.

6. The gate driving circuit of claim 5, further comprising a fifth control transistor applying a second discharge voltage to the second node after the k-th gate signal is output.

7. The gate driving circuit of claim 6, wherein the fifth control transistor comprises a control electrode receiving a switching signal, an input electrode receiving the second discharge voltage, and an output electrode connected to the second node, and
   wherein the switching signal corresponds to a (k+1)-th carry signal output from a (k+1)-th driving stage of the driving stages.

8. A gate driving circuit comprising:
   a plurality of driving stages, each of which applies a corresponding one of gate signals to a corresponding one of gate lines of a display panel,
   wherein a k-th (k is a natural number equal to or greater than 2) driving stage among the driving stages comprising:
   an output part outputting a k-th gate signal through a k-th output node and a k-th carry signal through a k-th carry node in response to a voltage of a first node, wherein the k-th gate signal and the k-th carry signal are generated on the basis of a clock signal;
   a control part controlling the voltage of the first node;
   an inverter part outputting a switching signal generated on the basis of the clock signal; and
   a pull-down part pulling down voltages of the k-th output node and the k-th carry node, wherein the control part comprising:
- a first control transistor applying a first control signal to a second node to control a voltage of the first node before the k-th gate signal is output;
- a second control transistor comprising control and input electrodes commonly connected to the second node, and an output electrode connected to the first node; and
- a third control transistor comprising control and input electrodes commonly receiving the k-th carry signal, and an output electrode connected to the second node.

9. The gate driving circuit of claim 8, wherein the first control transistor comprises control and input electrodes commonly receiving a (k−1)-th carry signal output from a (k−1)-th driving stage, and an output electrode outputting the first control signal.

10. The gate driving circuit of claim 8, wherein the control part further comprises:
- a capacitor increasing the voltage of the first node in response to the k-th gate signal;
- a fourth control transistor applying a first discharge voltage to the first node in response to a (k+1)-th carry signal output from a (k+1)-th driving stage after the k-th gate signal is output; and
- a fifth control transistor applying a second discharge voltage to the first node in response to the switching signal after the first discharge voltage is applied to the first node through the fourth control transistor.

11. The gate driving circuit of claim 8, wherein the output part comprises:
- a first output transistor outputting the k-th gate signal; and
- a second output transistor outputting the k-th carry signal.

12. The gate driving circuit of claim 11, wherein the pull-down part comprises:
- a first pull-down part pulling down a voltage of an output electrode of the first output transistor upon the arrival of the (k+1)-th carry signal; and
- a second pull-down part pulling down a voltage of an output electrode of the second output transistor upon the arrival of the (k+1)-th carry signal.

13. The gate driving circuit of claim 12, wherein the first pull-down part comprises:
- a first pull-down transistor applying a first discharge voltage to the output electrode of the first output transistor in response to the (k+1)-th carry signal; and
- a second pull-down transistor applying the first discharge voltage to the output electrode of the first output transistor in response to the switching signal after the first discharge voltage is applied to the output electrode of the first output transistor through the first pull-down transistor.

14. The gate driving circuit of claim 13, wherein the second pull-down part comprises:
- a third pull-down transistor applying a second discharge voltage to the output electrode of the second output transistor in response to the (k+1)-th carry signal; and
- a fourth pull-down transistor applying the second discharge voltage to the output electrode of the second output transistor in response to the switching signal after the second discharge voltage is applied to the output electrode of the second output transistor through the third pull-down transistor.

* * * * *